United States Patent [19]
Yoon

[11] Patent Number: 5,633,833
[45] Date of Patent: May 27, 1997

[54] ADDRESS BUFFER FOR BLOCKING NOISE

[75] Inventor: Yeon-Joong Yoon, Inchon, Rep. of Korea

[73] Assignee: LG Semicon Co., Ltd., Cheongju, Rep. of Korea

[21] Appl. No.: 573,834

[22] Filed: Dec. 18, 1995

[30] Foreign Application Priority Data

Jun. 30, 1995 [KR] Rep. of Korea ............... 18702/1995

[51] Int. Cl.[6] ............... H03K 17/16; G11C 7/00
[52] U.S. Cl. ............ 365/230.08; 365/233; 365/233.5; 365/230.01
[58] Field of Search ............... 365/207, 189.01, 365/230.01, 230.08, 233, 233.5; 326/28

[56] References Cited

U.S. PATENT DOCUMENTS 4,451,745  5/1984  Itoh et al. .
5,450,019  9/1995  McClure et al. ............... 326/28
5,459,693  10/1995  Komarek et al. ............... 365/207

Primary Examiner—Viet Q. Nguyen
Attorney, Agent, or Firm—Fleshner & Kim

[57] ABSTRACT

An address buffer capable of preventing malfunctions of a memory device or preventing delay of the signal outputted from the output buffer by blocking noise, which inverts or blocks the signal outputted from the address signal input unit according to a PMOS control signal and an NMOS control signal, and latches the signal outputted from the clock inverter in the latch unit. The PMOS and the NMOS control signals are outputted to the clock inverter by logically operating the control signal outputted from the control signal generating unit according to the output signal of the latch unit, thereby blocking a noise generated in the address input unit by the signal outputted from the output buffer by the clock inverter.

13 Claims, 3 Drawing Sheets

FIG. 3
CONVENTIONAL ART
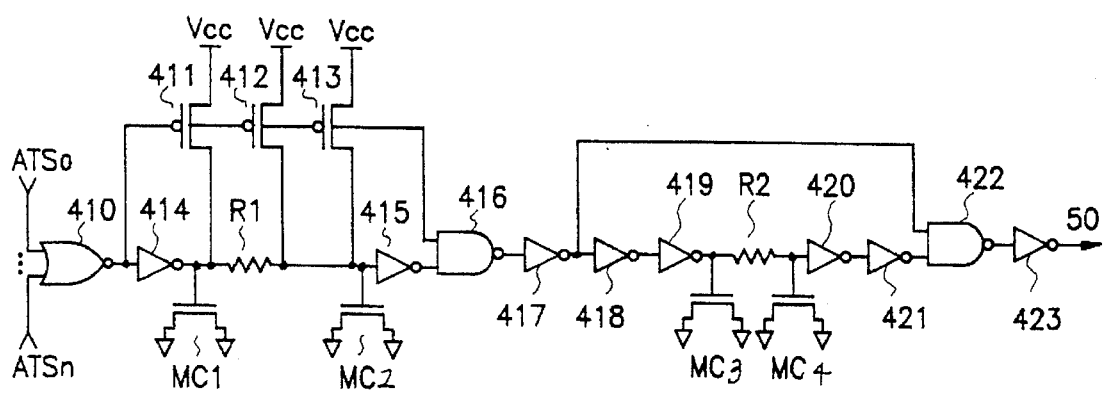
FIG.4A
CONVENTIONAL ART
FIG.4B
CONVENTIONAL ART
FIG.4C
CONVENTIONAL ART
FIG.4D
CONVENTIONAL ART
FIG.4E
CONVENTIONAL ART
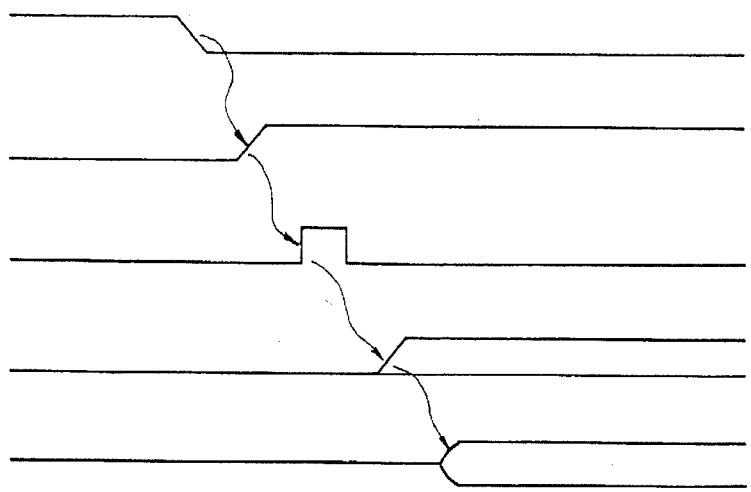
FIG.5A
CONVENTIONAL ART
FIG.5B
CONVENTIONAL ART
FIG.5C
CONVENTIONAL ART
FIG.5D
CONVENTIONAL ART
FIG.5E
CONVENTIONAL ART

ADDRESS BUFFER FOR BLOCKING NOISE

BACKGROUND OF THE INVENTION

1. Field of the Invention

The present invention relates to an address buffer included in a memory device, and particularly to an address buffer which is capable of preventing malfunctions of a memory device or preventing delay of the signal outputted from the output buffer by blocking a noise generated in the address signal input unit caused by the operation of a sense amplifier or an output buffer, using a clock inverter.

2. Description of the Conventional Art

Referring to FIG. 1, the conventional address buffer includes an address signal input unit 10 for receiving a chip selection signal CSB and an address signal bit Ai from the outside of the memory device; a first inverter 20 for inverting the signal outputted from the address signal input unit 10; a second inverter 21 for outputting the inverted internal address signal bit ANB to an address decoder by inverting the signal outputted from the first inverter 20; a third inverter 22 for outputting the internal address signal bit AN to the address decoder by inverting the inverted internal address signal bit ANB outputted from the second inverter 21; an address transition detecting unit 30 for outputting the address transition detection signal ATSo according to the signal outputted from the first inverter 20; and a control signal generating unit 40 for generating the control signal to control an output buffer 50 which is provided at the outside of the address buffer, according to the address transition detection signal ATSo outputted from the address transition detecting unit 30 and the address transition detection signals ATS1 to ATSn outputted from another address transition detecting units.

The elements such as the address signal input unit 10, the first and third inverters 20 and 30, and the address transition detecting unit 30 exist as much as the number of the bits of the address signals. Here, the elements corresponding to only one bit are shown, for the simplicity.

The address signal input unit 10 includes a first NOR gate 11 for NORing the chip selection signal CSB and the address signal bit Ai, a fourth inverter 16 for inverting the signal outputted from the first NOR gate 11, and a fifth inverter 17 for inverting the signal outputted from the fourth inverter 16.

The first NOR gate 11 includes a first PMOS transistor 12 having a gate to which the chip selection signal CSB is applied and having a source to which the supply voltage of 5V is applied; a second PMOS transistor 13 having a gate to which the address signal bit Ai is inputted and having a source to which the drain of the first PMOS transistor 12 is connected; a first NMOS transistor 14 having a gate to which the address signal bit Ai is inputted, having a drain to which the drain of the second PMOS transistor 12 is connected, and having a source to which the ground voltage VSS is applied; and a second NMOS transistor 15 having a gate to which the chip selection signal CSB is inputted, having a drain to which the drains of the second PMOS transistor 13 and the first NMOS transistor 14 are commonly connected, and having a source to which the ground voltage VSS is applied to.

As shown in FIG. 2, the address transition detecting unit 30 includes sixth to twelfth inverters 31, 32, 33, 34, 35, 36 and 37 for successively inverting the signal outputted from the first inverter 20; a first transmission gate TG1 for transmitting the signal outputted from the seventh inverter 32, according to the signals outputted from the eleventh and twelfth inverters 36 and 37; a second transmission gate TG2 for transmitting the signal outputted from the sixth inverter 31, according to the signals outputted from the eleventh and twelfth inverters 36 and 37; a thirteenth inverter 38 for outputting the address transition detection signal ATSo to the control signal generating unit 40 by inverting the signal outputted from the first and second transmission gates TG1 and TG2.

The control signal generating unit 40, as shown in FIG. 3, includes a second NOR gate 410 for NORing the address transition detection signals ATSo to ATSn; third to fifth transistors 411, 412, and 413 each having a gate to which the signal outputted from the second NOR gate 410 is commonly inputted and each having a source to which the supply voltage VCC of 5 V is applied; a fourteenth inverter 414 for inverting the signal outputted from the second NOR gate 410; a first NMOS capacitor MC1 being commonly connected with the output terminal of the fourteenth inverter 414 and with the drain of the third PMOS transistor 411; a first resistor R1 having one end connected to the first NMOS capacitor MC1 and to the drain of the third PMOS transistor 411; a second NMOS capacitor MC2 being commonly connected with the other end of the first resistor R1 and with the drain of the fourth and fifth PMOS transistors 412 and 413; a fifteenth inverter 415 for inverting the delayed signal by the second NMOS capacitor MC2, the first NMOS capacitor MC1 and the first resistor R1; a first NAND gate 416 for NANDing the signals outputted from the fifteenth inverter 415 and the second NOR gate 410; a sixteenth inverter 417 for inverting the signal outputted from the first NAND gate 416; a seventeenth inverter 418 for inverting the signal outputted from the sixteenth inverter 417; an eighteenth inverter 419 for inverting the signal outputted from the seventeenth inverter 418; a third NMOS capacitor MC3 being connected to output terminal of the eighteenth inverter 419; a second register R2 having one end connected to the third NMOS capacitor MC3; a fourth NMOS capacitor MC4 being connected to the other end of the second resistor R2; a nineteenth inverter 420 for inverting the signal delayed by the fourth and third NMOS capacitors MC4 and MC3 and the second resistor R2; a twentieth inverter 421 for inverting the signal outputted from the nineteenth inverter 420; a second NAND gate 422 for NANDing the signals outputted from the twentieth and sixteenth inverters 421 and 417; and a twenty-first inverter 423 for outputting the inverted signal to the output buffer 50 by inverting the signal outputted from the second NAND gate 422.

The operation of the conventional address buffer will be described, with reference to the drawings.

FIGS. 4A to 4E show the normal operations of the conventional address buffer without a noise.

When the chip selection signal CSB of low voltage level is inputted to the first NOR gate 11, the first PMOS transistor 12 is turned on, and the second NMOS transistor 15 is turned off. As shown in FIG. 4A, when the address signal bit A1 transited from high to low voltage level is inputted to the first NOR gate 11, the second PMOS transistor 13 is turned on and the first NMOS transistor is turned off. Then the signal of high voltage level is outputted from the first NOR gate 11, and the signal of high voltage level is inverted successively by the third and fourth inverters 16 and 17 in which fan-out effect is considered. As shown in FIG. 4B, the signal of high voltage level is outputted from the address signal input unit 10, and inverted by the first inverter 20. The inverted signal of low voltage level is outputted to the second inverter 21 and to the address transition detecting unit 30.

Next, the second inverter 21 outputs the inverted internal address signal bit ANB of high voltage level to the address decoder, and the third inverter 22 outputs the internal address signal bit AN of low voltage level to the address decoder by inverting the inverted internal address signal bit ANB outputted from the second inverter 21.

Further, when the signal outputted from the first inverter 20 is transited from high to low voltage level, the address transition detecting unit 30 outputs a pulse signal of high voltage level, i.e., the address transition detection signal ATSo to the control signal generating unit 40, as shown in FIG. 4C.

That is, referring to FIG. 2, the signal of high voltage level outputted from the first inverter 20 is inverted by the sixth inverter 31, the signal of low voltage level is outputted to the second transmission gate TG2 and to the seventh inverter 32, and the signal of high voltage level outputted from the seventh inverter 32 is outputted to the first transmission gate TG1 and to the eighth inverter 33. As the signal of high voltage level is inverted by the eighth to eleventh inverters 33, 34, 35 and 36 successively, the signal of high voltage level delayed for a predetermined time is outputted to the NMOS transistor of the first transmission gate TG1 and to the PMOS transistor of the second transmission gate TG2, and the signal of low voltage level outputted from the twelfth inverter 37 is outputted to the PMOS transistor of the first transmission gate TG1 and to the NMOS transistor of the second transmission gate TG2.

Accordingly, the first transmission gate TG1 is turned on and the second transmission gate TG2 is turned off. The signal of high voltage level outputted from the first transmission gate TG1 is inverted by the thirteenth inverter 38 and the address transition detection signal ATSo of low voltage level is outputted to the control signal generating unit 40.

When the signal transited from high to low voltage level is inputted to the sixth inverter 31, the signal of high voltage level outputted from the sixth inverter 31 is inputted to the second transmission gate TG2, and the signal of low voltage level outputted from the seventh inverter 32 is outputted to the first transmission gate TG1. At this time, as the first transmission gate TG1 is turned on, the signal of low voltage level outputted from the first transmission gate TG1 is inverted by the thirteenth inverter 38, and the address transmission detection signal ATSo of high voltage level is outputted to the control signal generating unit 40. Next, after the signal of low voltage level is delayed by the eighth to eleventh inverters 33, 34, 35, and 36, it is outputted to the NMOS transistor of the first transmission gate TG1 and to the PMOS transistor of the second transmission gate TG2, and the signal of high voltage level is outputted to the PMOS transistor of the first transmission gate TG1 and to the NMOS transistor of the second transmission gate TG2 by the twelfth inverter 37.

Accordingly, the first transmission gate TG1 is turned off and the second transmission gate TG2 is turned on. The signal of high voltage level outputted from the second transmission gate TG2 is inverted by the thirteenth inverter 38 and the address transition detection signal ATSo of low voltage level is outputted to the control signal generating unit 40.

As a result, data corresponding to the address transited to low voltage level is outputted from the memory, and the outputted data is amplified by a sense amplifier. The amplified data S/A is outputted to the output buffer 50, as shown in FIG. 4D.

The signal of low voltage level is outputted to the third to fifth PMOS transistors 411, 412, and 413, and the fourteenth inverter 414 by the second NOR gate 410 of the control signal generating unit 40. The third to fifth PMOS transistors 411, 412, and 413 are turned on, and the fourteenth inverter 414 outputs the signal of high voltage level. And, the outputted signal of high voltage level is delayed for a predetermined time according to the time constant of the first and second NMOS capacitors MC1 and MC2, and the resistor R1. The delayed signal is inverted by the fifteenth inverter 415 and the signal of low voltage level is inputted to the one end of the first NAND gate 416. Further, the signal of low voltage level outputted from the second NOR gate 410 is inputted to the other end of the first NAND gate 416, and the signal of high voltage level is outputted by the first NAND gate 416. Here, the outputted signal of high voltage level is inverted by the sixteenth inverter 417 and the signal of low voltage level is inputted to the one end of the second NAND gate 422 and to the seventeenth inverter 418.

Next, the signal of low voltage level is inverted successively by the seventeenth and eighteenth inverters 418 and 419, and the signal of low voltage level outputted from the eighteenth inverter 419 is delayed for a predetermined time according to the time constant of the third and fourth NMOS capacitors MC3 and MC4, and the second resistor R2. The delayed signal is successively inverted by the nineteenth and twentieth inverters 420 and 421 and a signal low voltage level is inputted to the other end of the second NAND gate 422. Accordingly, the signal of high voltage level is inverted by the twenty-first inverter 423 and the control signal of low voltage level is outputted to the output buffer 50.

The output buffer 50 is driven by the control signal outputted from the twenty-first inverter 423 and outputs the output signal DQ shown in FIG. 4E to the outside of the memory device by buffering the data S/A outputted from the sense amplifier.

FIGS. 5A to 5E show malfunction state of the conventional address buffer by a noise.

Referring to the drawings, the address signal bit Ai is transited from high to low voltage level as shown in FIG. 5A, and the output signal DQ is outputted to the outside of the memory device by the output buffer 50 as shown in FIG. 5E. However, when the data S/A or the output signal DQ is outputted, the electric potential of the internal power supply such as the supply voltage VCC or the ground voltage VSS becomes unstable, and a noise is generated by the first NOR gate 11 of the address signal input unit 10 as shown in FIG. 5B. The noise is processed successively by the fourth and fifth inverters 16 and 17 and the first to third inverters 20, 21 and 22 successively, and the address transition detection signal ATSo as shown in FIG. 5C is outputted to the control signal generating unit 40 by the address transition detection unit 30. Then, the data S/A is reset as shown in FIG. 5D, and the output signal DQ is set as shown in FIG. 5E.

The data S/A amplified by the sense amplifier is delayed and outputted to the output buffer 50 as shown in FIG. 5E. The control signal generating unit 40 outputs a control signal of low voltage level to the output buffer 50 according to the operations illustrated in FIGS. 4A to 4E, and the delayed output signal DQ is outputted to the outside of the memory device according to the outputted signal of low voltage level, as shown in FIG. 5E.

However, the conventional address buffer has a problem in that when the data from the sense amplifier is outputted to the output buffer, or when the output signal from the output buffer is outputted to the outside of the memory device, the electric potential of the internal power supply becomes unstable, thereby noise is generated from the address signal input unit and the address transition detection signal is outputted due to the noise. In result, the sense amplifier and the output buffer are reset and their operations are delayed, and further, timing mismatch is generated due to the address transition detection signal which is generated abnormally, thereby causing malfunction of the memory device.

SUMMARY OF THE INVENTION

Therefore, it is object of the present invention to provide an address buffer which prevents malfunction of the memory device or prevents delay of the signal outputted from the output buffer by blocking a noise generated in the address signal input unit caused by the operations of the sense amplifier or output buffer, using a clock inverter.

To achieve the above object, the buffer includes an address signal input unit for performing a logical operation of the chip selection signal and the address signal bit inputted from the outside; a clock inverter for inverting or blocking the signal outputted from the address signal input unit according to the PMOS and NMOS control signals; a latch unit for latching the signal outputted from the clock inverter; a twenty-second inverter for outputting the internal address signal bit to the address decoder by inverting the signal outputted from the latch unit; a twenty-third inverter for outputting the inverted internal address signal bit to the address decoder by inverting the internal address signal outputted from the twenty-second inverter; an address transition detecting unit for outputting the address transition detection signal according to the signal outputted from the latch unit; a control signal generating unit for outputting the control signal generated by the signal outputted from the address transition detecting unit to the output buffer; and a clock inverter control signal generating unit for delaying the control signal outputted from the control signal generating unit for a predetermined time, performing a logical operation of the delayed signal and the control signal, and outputting the PMOS and NMOS control signals to the clock inverter.

BRIEF DESCRIPTION OF DRAWINGS

The above object and advantages of the present invention will be more clearly understood from the following detailed description taken in conjunction with the accompanying drawings, in which:

FIG. 3 is a detailed diagram of the control signal generating unit of FIG. 1;

FIGS. 4A to 4E are timing diagrams of FIG. 1 in normal operation, in which; FIG. 4A is a waveform of the address signal bit in FIG. 1; FIG. 4B is a waveform of the signal outputted from the address signal input unit in FIG. 1; FIG. 4C is a waveform of the address signal transition detection signal in FIG. 1; FIG. 4D is a waveform of the data inputted to the output buffer of FIG. 1 from the sense amplifier; and FIG. 4E is a waveform of the signal outputted from the output buffer in FIG. 1;

FIGS. 5A to 5E are timing diagrams of FIG. 1 when a noise is present, in which; FIG. 5A is a waveform of the address signal bit in FIG. 1; FIG. 5B is a waveform of the signal outputted from the address signal input unit in FIG. 1; FIG. 5C is a waveform of the address signal transition detection signal in FIG. 1; FIG. 5D is a waveform of the data inputted to the output buffer in FIG. 1 from the sense amplifier; and FIG. 5E is a waveform of the signal outputted from the output buffer in FIG. 1;

FIG. 7A is a waveform of the address signal bit in FIG. 6; FIG. 7B is a waveform of the signal outputted from the address signal input unit in FIG. 6; FIG. 7C is a waveform of the address signal transition detection signal in FIG. 6; FIG. 7D is a waveform of the control signal outputted from the control signal generating unit in FIG. 6; FIG. 7E is a waveform of the output signal of the output buffer in FIG. 6; FIG. 7F is a waveform of the PMOS control signal in FIG. 6; and FIG. 7G is a waveform of the NMOS control signal in FIG. 6.

DETAILED DESCRIPTION OF THE PREFERRED EMBODIMENTS

Figure 6:
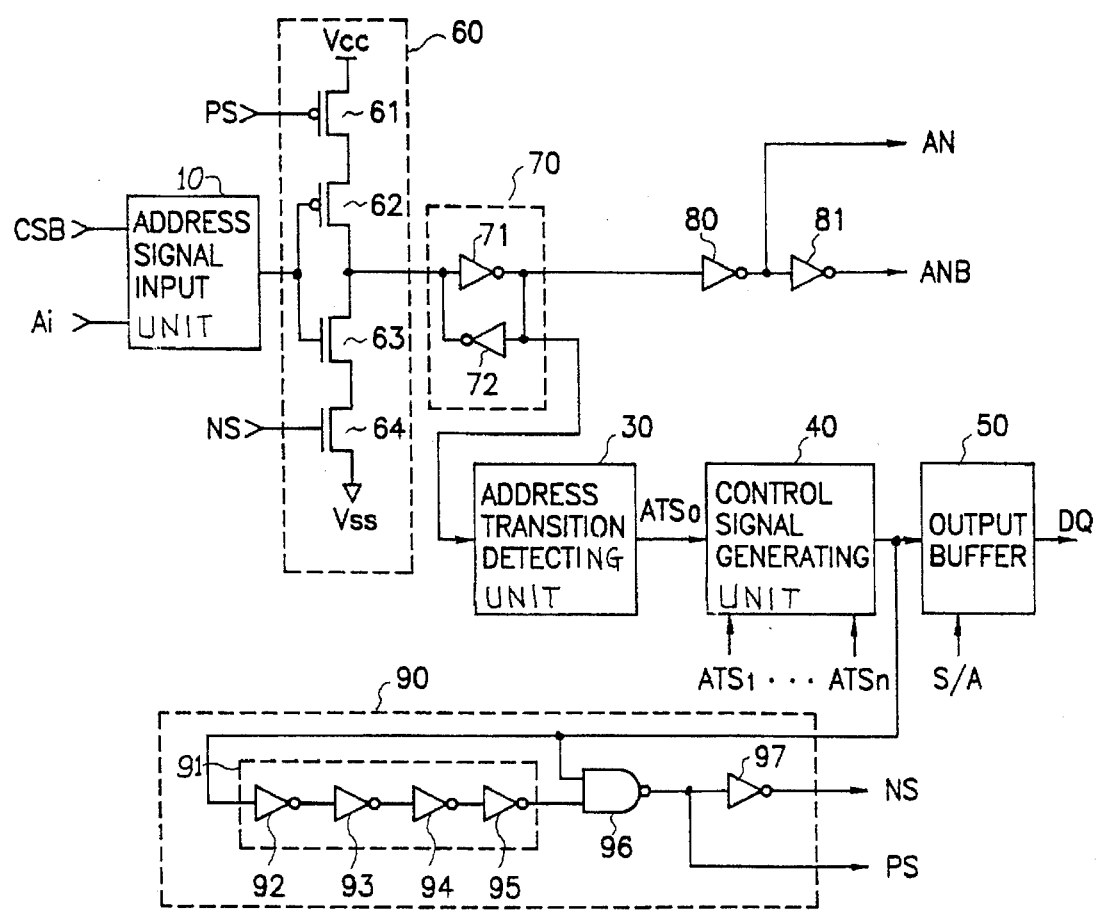
FIG. 6 shows an address buffer and an output buffer according to the present invention.

Referring to FIG. 6, an address buffer which prevents a noise according to the present invention includes an address signal input unit 10 for receiving a chip selection signal CSB and an address signal bit Ai from the outside of the memory device; a clock inverter 60 for inverting or blocking the signal outputted from the address signal input unit 10 according to an NMOS control signal NS and a PMOS control signal PS; a latch unit 70 for latching the signal outputted from the clock inverter 60; a first inverter 80 for outputting the internal address signal AN to an address decoder by inverting the signal outputted from the latch unit 70; a second inverter 81 for outputting the inverted internal address signal ANB to the address decoder by inverting the signal outputted from the first inverter 80; an address transition detecting unit 30 for outputting the address transition detection signal ATSo according to the signal outputted from the latch unit 70; a control signal generating unit 40 for generating the control signal in order to control an output buffer 50 which is provided at the outside of the address buffer according to the address transition detection signal ATSo outputted from the address transition detecting unit 30 and the address transition detection signals ATS1 to ATSn outputted from another address transition detecting units; and a clock inverter control signal generating unit 90 for outputting the NMOS and PMOS control signals NS and PS to the clock inverter 60 by delaying the control signal outputted from the control signal generating unit for a predetermined time and by logically operating the delayed signal and the control signal outputted from the control signal generating unit 40.

The clock inverter 60 includes a first PMOS transistor 61 having a gate to which the PMOS control signal PS is applied and having a source to which the supply voltage is applied; a second PMOS transistor 62 having a gate to which the signal outputted from the address signal input unit 10 is inputted and having a source to which the drain of the first PMOS transistor 61 is connected; a first NMOS transistor 63 having a gate to which the signal outputted from the address signal input unit 10 is inputted and having a drain to which the drain of the second PMOS transistor 62 is connected; and the second NMOS transistor NS having a gate to which the NMOS control signal 64 is inputted, having a drain to which the drain of the first NMOS transistor 63 is connected, and having a source to which the ground voltage VSS is applied.

The latch unit 70 includes a third inverter 71 for inverting the signal outputted from the clock inverter 60, and a fifth inverter 72 for inverting the signal outputted from the third inverter 71 and outputting the inverted signal to the third 71.

The clock inverter control signal generating unit 90 includes a delay unit 91 for delaying the control signal outputted from the control signal generating unit 40 for a predetermined time; a first NAND gate 96 for NANDing the inputted signals after inputting the signal outputted from the delay unit 91 to the one end and inputting the control signal outputted from the control signal generating unit 40 to the other end, respectively, and outputting the NANDed PMOS control signal PS to the clock inverter 60; and a fifth inverter 97 for outputting the NMOS control signal NS to the clock inverter 60 by inverting the PMOS control signal outputted from the first NAND gate 96.

The delay unit 91 includes sixth to eighth to twenty-ninth inverters 92, 93 and 94 for inverting successively the control signal outputted from the control signal generating unit 40, and a ninth inverter 95 for outputting the inverted signal to the one end of the first NAND gate 96 by inverting the signal outputted from the eighth inverter 94.

Figure 1:
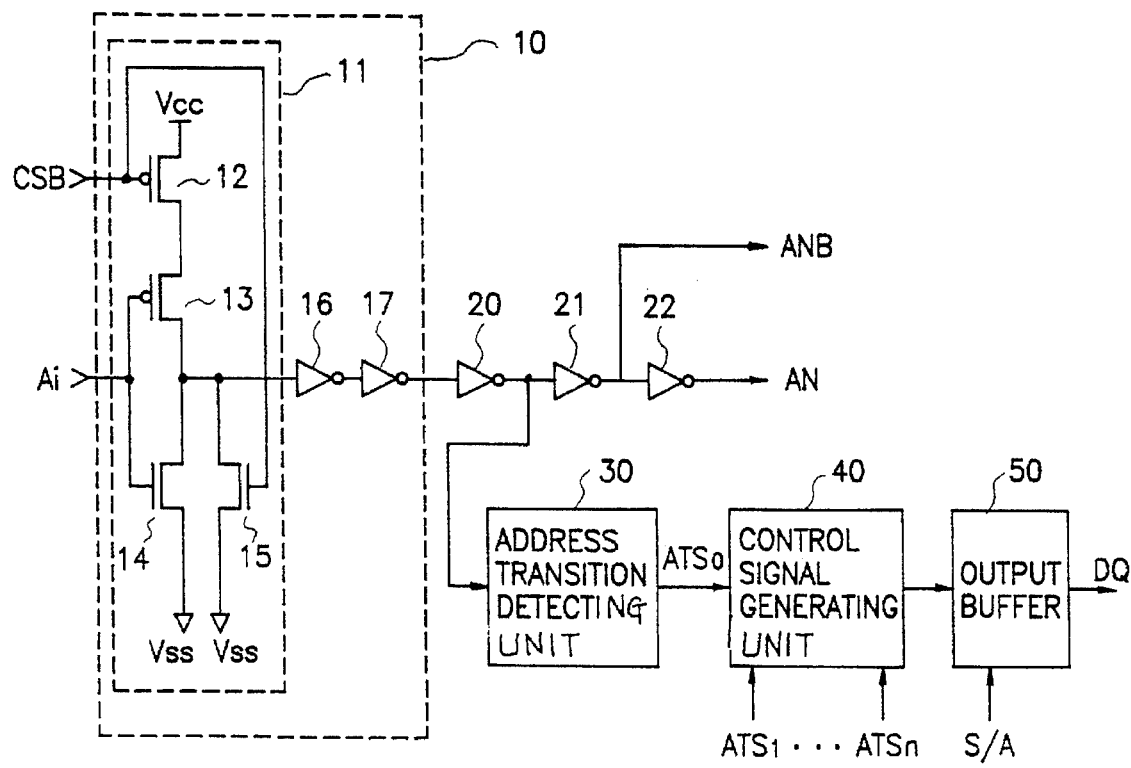
FIG. 1 shows a conventional address buffer and an output buffer.
Figure 2:
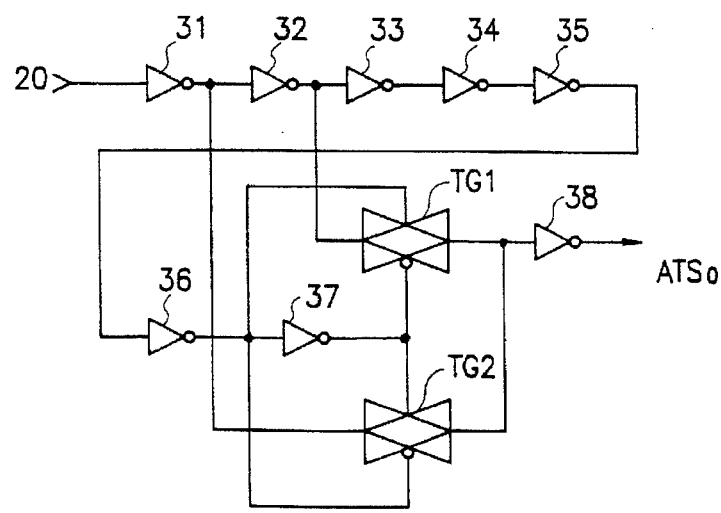
FIG. 2 is a detailed diagram of an address transition detecting unit of FIG. 1.

The address signal input unit 10, the address transition detecting unit 30 and the control signal generating unit 40 are structurally the same as those of FIG. 1.

The detailed description the present invention will be followed with reference to FIG. 7.

Figure 7A:
FIGS. 7A to 7G are timing diagrams of FIG. 6, in which;.
Figure 7B:

When the chip selection signal CSB of low voltage level is inputted to the address signal input unit 10, if the address signal is inputted to the address signal input unit 10 after being transited from high to low voltage level as shown in FIG. 7A, the signal outputted from the address signal input unit 10 is transited from low to high voltage level, as shown in FIG. 7B.

Next, the second PMOS transistor 62 is turned off and the first NMOS transistor 63 is turned on according to the signal of high voltage level. The first PMOS transistor 61 is turned on according to the PMOS control signal PS of low voltage level as shown in FIG. 7F, and the second NMOS transistor 64 is turned on according to the NMOS control signal NS of high voltage level as shown in FIG. 7G.

The signal of low voltage level is inputted to the latch unit 70, and the inputted signal of low voltage level is inverted by the third inverter 71, then the inverted signal is inverted by the fourth inverter 72. After the inverted signal is inputted to the third inverter 71, the latched signal of high voltage level is inputted to the first inverter 80 and to the address transition detecting unit 30.

Next, the latched signal of high voltage level is inverted by the first inverter 80, and the internal address signal bit AN of low voltage level is outputted to the address decoder. The internal address signal bit AN is inverted by the twenty-first inverter 81 and inverted internal address signal bit ANB of high voltage level is outputted to the address decoder.

Figure 7C:
Figure 7D:
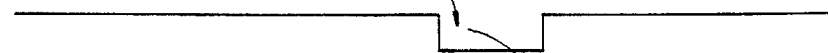

As shown in FIG. 7C, the address transition detecting unit 30 outputs the address transition detection signal ATSo of high voltage level to the control signal generating unit 40, and the control signal generating unit 40 outputs the control signal of low voltage level to the output buffer 50 and to the clock inverter control signal generating unit 90 for a predetermined time, as shown in FIG. 7D.

Figure 7E:
Figure 7F:
Figure 7G:

The output buffer 50 outputs the output signal DQ to the outside of the memory device according to the control signal of low voltage level, as shown in FIG. 7E. The control signal of low voltage level is inputted to the one end of the first NAND gate 96 and the signal of low voltage level which is delayed for a predetermined time is inputted to the other end of the first NAND gate 96 after being inverted successively by the sixth to ninth inverters 92, 93, 94 and 95. After that, the PMOS control signal PS of high voltage level is outputted to the first PMOS transistor 61 of the clock inverter 60 by the first NAND gate 96 as shown in FIG. 7F. The NMOS control signal PS of high voltage level is inverted by the fifth inverter 97 and the NMOS control signal of low voltage level is outputted to the second NMOS transistor 64 of the clock inverter 60.

As the first PMOS transistor 61 and the second NMOS transistor 64 are turned off, the clock inverter 60 is turned off. When the output signal is outputted from the output buffer 50, a noise generated in the address input unit 10 is blocked by the clock inverter 60, and the latch unit 70 has the previous output signal.

After the output signal DQ is stable, the PMOS control signal PS is transited to low voltage level as shown in FIG. 7F. As the NMOS control signal NS is transited to high voltage level as shown in FIG. 7G, the clock inverter 60 is turned on and the latch unit 70 receives a new input according to the signal outputted from the address signal input unit 10.

As hereinbefore described, the address buffer according to the present invention blocks a noise generated in the address signal input unit caused by the operations of the sense amplifier or output buffer by blocking the clock inverter according to the PMOS control signal and the NMOS control signal outputted from the clock inverter control signal generating unit. Accordingly, the address buffer of the present invention prevents malfunctions of the memory device or delay of the output signal from the output buffer caused by the noise.

What is claimed is:

1. An address buffer for blocking a noise comprising:

an address signal input means for receiving a chip selection signal and an address signal bit;

a clock inverter means for inverting or blocking a signal outputted from the address signal input means according to an NMOS control signal and a PMOS control signal;

a latch means for latching a signal outputted from the clock inverter means;

a first inverter for outputting an internal address signal to an address decoder by inverting a signal outputted from the latch means;

a second inverter for outputting an inverted internal address signal to the address decoder by inverting the internal address signal outputted from the first inverter;

an address transition detecting means for outputting an address transition detection signal according to the signal outputted from the latch means;

a control signal generating means for outputting a control signal generated by the signal outputted from the address transition detecting means to an output buffer; and a clock inverter control signal generating means for outputting the NMOS and PMOS control signals to the clock inverter means by delaying the control signal outputted from the control signal generating means for a predetermined time and by logically operating the delayed signal and the control signal outputted from the control signal generating means.

2. The buffer of claim 1, wherein the clock inverter means includes;

a first PMOS transistor having a gate to which the PMOS control signal is applied and having a source for receiving a supply voltage;

a second PMOS transistor having a gate to which the signal outputted from the address signal input means is inputted and having a source to which the drain of the first PMOS transistor is connected;

a first NMOS transistor having a gate to which the signal outputted from the address signal input means is inputted and having a drain to which the drain of the second PMOS transistor is connected; and a second NMOS transistor having a gate to which the NMOS control signal is inputted, a drain to which the drain of the first NMOS transistor is connected, and a source for connection to a ground voltage.

3. The buffer of claim 1, wherein the latch means includes;

a third inverter for inverting the signal outputted by the clock inverter means; and a fourth inverter for inverting the signal outputted from the third inverter and outputting the inverted signal to the third inverter.

4. The buffer of claim 1, wherein the clock inverter control signal generating means includes;

a delay means for delaying the control signal outputted from the control signal generating means for a predetermined time;

a NAND gate having first and second input electrodes, said first input electrode receiving a signal outputted from the delay means and said second input electrode receiving the control signal outputted from the control signal generating means and outputting the PMOS control signal to the clock inverter means; and a fifth inverter for outputting the NMOS control signal to the clock inverter means by inverting the PMOS control signal outputted from the first NAND gate.

5. The buffer of claim 4, wherein the delay means includes sixth to ninth inverters for inverting successively the control signal outputted from the control signal generating means.

6. The buffer of claim 1, wherein the clock inverter means is turned off by the PMOS control signal of high level and by the NMOS control signal of low level, and blocks the output signal of the address signal input means when the output buffer generates an output signal.

7. A buffer for a memory device comprising:

an address signal input unit receiving a first signal and an address signal bit;

an inverter unit coupled to said address signal input unit and being responsive to first and second control signals;

a latch unit coupled to said inverter unit;

an address transition detecting unit coupled to said latch unit;

a control signal generating unit coupled to said address transition detecting unit;

an output buffer coupled to said first control signal generating unit; and an inverter control unit coupled to said first control signal generating unit and generating said first and second control signals to control an operation of said inverter unit.

8. The buffer of claim 7, further comprising:

a first inverter coupled to said latch unit such that a first address signal is generated; and a second inverter coupled to said first inverter such that a second address signal is generated.

9. The buffer of claim 7, wherein said latch unit comprises:

a third inverter for inverting an output signal from said inverter unit; and a fourth inverter for inverting an output signal from said first inverter and providing its output to said third inverter.

10. The buffer of claim 7, wherein said inverter unit comprises a plurality of transistors coupled in series between a voltage source and a ground potential, each transistor having control, first and second electrodes, control electrodes of two of said plurality of transistors being coupled to each other and coupled to said address signal input unit, and control electrodes of two of said plurality of transistors receiving said first and second control signals.

11. The buffer of claim 7, wherein said inverter control unit comprises:

a logic gate having a first and second input electrodes, said first input electrode receiving a signal outputted from said control signal generating unit; and a delay unit receiving the signal to provide a delayed signal to said second input electrode, said logic gate performing a logical operation to output at least one of said first and second control signal.

12. The buffer of claim 11, wherein said inverter control unit further comprises a fifth inverter coupled to said logic gate to output said second control signal.

13. The buffer of claim 12, wherein said delay unit comprises a plurality of inverters coupled in series.

* * * * *